(12) United States Patent
Zhang

(10) Patent No.: US 12,029,072 B2
(45) Date of Patent: Jul. 2, 2024

(54) ORGANIC LIGHT EMITTING DIODE (OLED) DISPLAY PANEL AND METHOD OF FABRICATING SAME

(71) Applicant: WUHAN CHINA STAR OPTOELECTRONICS SEMICONDUCTOR DISPLAY TECHNOLOGY CO., LTD., Wuhan (CN)

(72) Inventor: Weibin Zhang, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 1008 days.

(21) Appl. No.: 16/965,656

(22) PCT Filed: Jul. 21, 2020

(86) PCT No.: PCT/CN2020/103236
§ 371 (c)(1),
(2) Date: Jul. 29, 2020

(87) PCT Pub. No.: WO2021/253561
PCT Pub. Date: Dec. 23, 2021

(65) Prior Publication Data
US 2023/0165067 A1 May 25, 2023

(30) Foreign Application Priority Data
Jun. 19, 2020 (CN) .......................... 202010568018.7

(51) Int. Cl.
*H10K 59/121* (2023.01)
*H10K 59/131* (2023.01)
*H10K 71/60* (2023.01)

(52) U.S. Cl.
CPC ....... *H10K 59/1213* (2023.02); *H10K 59/131* (2023.02); *H10K 71/60* (2023.02)

(58) Field of Classification Search
CPC ............. H10K 59/1213; H10K 59/123; H10K 59/131; H10K 71/60
See application file for complete search history.

(56) References Cited

U.S. PATENT DOCUMENTS

2019/0355799 A1* 11/2019 Jeong ................. H10K 59/1213
2020/0235135 A1* 7/2020 Yang .................... H01L 27/1248

FOREIGN PATENT DOCUMENTS

CN 110164868 A * 8/2019 ............. H01L 27/02

* cited by examiner

*Primary Examiner* — Robert G Bachner
*Assistant Examiner* — Molly K Reida
(74) *Attorney, Agent, or Firm* — PV IP PC; Wei Te Chung; Zhigang Ma

(57) ABSTRACT

An organic light-emitting diode (OLED) display panel is provided, including an array layer. The array layer includes a first source electrode and a second source electrode that are disposed in contact with each other, and a first drain electrode and a second drain electrode that are disposed in contact with each other. The first source electrode and the first drain electrode are in contact with an active layer through via holes. The first source/drain electrode and the second source/drain electrode are disposed in contact with each other, thereby reducing a probability of abnormal via holes in a source/drain region and facilitating wiring in the source/drain region.

7 Claims, 3 Drawing Sheets

ORGANIC LIGHT EMITTING DIODE (OLED) DISPLAY PANEL AND METHOD OF FABRICATING SAME

FIELD OF INVENTION

The present disclosure relates to the technical field of organic light-emitting diode (OLED) display, and particularly to an OLED display panel and a method of fabricating the OLED display panel.

BACKGROUND

In current organic light-emitting diode (OLED) display panels, via holes are formed in a source/drain region by a single etching. The via holes need to penetrate through four layers. In the single etching, due to different etching rates of different layers, problems such as different side-etching depths, uneven etching, etching residues, and excessive taper angles are likely to occur. This affects quality of subsequently formed source and drain electrodes, which in turn causes fracture or poor contact, resulting in reduced yield. Therefore, current OLED display panels have a technical problem of abnormal via holes in source/drain regions.

SUMMARY OF DISCLOSURE

The present disclosure provides an organic light-emitting diode (OLED) display panel and a method of fabricating the OLED display panel to solve the technical problem that current OLED display panels have abnormal via holes in source/drain regions.

The present disclosure provides an organic light-emitting diode (OLED) display panel comprising a substrate, an array layer, a pixel defining layer, a light-emitting function layer, and an encapsulation layer. The array layer comprises a buffer layer, and an active layer, a first gate insulating layer, a first gate electrode, a second gate insulating layer, a second gate electrode, a passivation layer, and an interlayer insulating layer that are sequentially disposed on the buffer layer. The array layer further comprises source electrodes and drain electrodes. The source electrodes comprise a first source electrode and a second source electrode directly disposed on the first source electrode. The drain electrodes comprise a first drain electrode and a second drain electrode directly disposed on the first drain electrode. The first source electrode and the first drain electrode are in contact with the active layer through via holes.

In the OLED display panel, the first source electrode and the first drain electrode are disposed in a same layer between the active layer and the interlayer insulating layer, and the second source electrode and the second drain electrode are disposed on the interlayer insulating layer.

In the OLED display panel, the first source electrode and the first drain electrode are disposed in the same layer as the second gate electrode.

In the OLED display panel, the first source electrode contacts the active layer through a first via hole penetrating through the first gate insulating layer and the second gate insulating layer.

In the OLED display panel, the second source electrode contacts the first source electrode through a second via hole penetrating through the passivation layer and the interlayer insulating layer.

In the OLED display panel, the first drain electrode contacts the active layer through a third via hole penetrating through the first gate insulating layer and the second gate insulating layer.

In the OLED display panel, the second drain electrode contacts the first drain electrode through the fourth via hole penetrating through the passivation layer and the interlayer insulating layer.

In the OLED display panel, the first source electrode and the first drain electrode are disposed in the same layer as the first gate electrode.

In the OLED display panel, the first source electrode contacts the active layer through a first via hole penetrating through the first gate insulating layer.

In the OLED display panel, the second source electrode contacts the first source electrode through a second via hole penetrating through the second gate insulating layer, the passivation layer, and the interlayer insulating layer.

In the OLED display panel, the first drain electrode contacts the active layer through a third via hole penetrating through the first gate insulating layer.

In the OLED display panel, the second drain electrode contacts the first drain electrode through the fourth via hole penetrating through the second gate insulating layer, the passivation layer, and the interlayer insulating layer.

In the OLED display panel, the first source electrode and the second source electrode are made of different materials, and the first drain electrode and the second drain electrode are also made of different materials.

In the OLED display panel, the first source electrode is made of a titanium/aluminum/titanium stacked structure.

In the OLED display panel, the second source electrode is made of titanium or silicon germanium.

The present disclosure further provides a method of fabricating an organic light-emitting diode (OLED) display panel, comprising:

providing a substrate;

sequentially forming a buffer layer, an active layer, a first gate insulating layer, a first gate electrode, and a second gate insulating layer on the substrate;

performing a first etching in a source/drain region and a bonding region to form a first source via hole and a first drain via hole penetrating through the first gate insulating layer and the second gate insulating layer;

forming a first metal layer on the second gate insulating layer;

patterning the first metal layer to form a second gate electrode, a first source electrode, and a first drain electrode;

sequentially forming a passivation layer and an interlayer insulating layer on the second gate electrode;

performing a second etching in the source/drain region and the bonding region to form a second source via hole and a second drain via hole penetrating through the passivation layer and the interlayer insulating layer;

forming a second metal layer on the interlayer insulating layer;

patterning the second metal layer to form a second source electrode and a second drain electrode;

sequentially forming a flat layer, a pixel defining layer, a light-emitting function layer, and an encapsulation layer on the second source electrode and the second drain electrode.

In the method of fabricating the OLED display panel, in the step of performing the first etching in the source/drain region and the bonding region, when etching gas in the source/drain region reaches the active layer, the first etching in the source/drain region and the bonding region is stopped.

In the method of fabricating the OLED display panel, in the step of performing the second etching in the source/drain region and the bonding region, after etching gas reaches the first source electrode and the first drain electrode in the source/drain region, the etching gas etches metal materials very slowly. Therefore, when the bonding region is etched to a preset depth by the second etching, the second etching in the source/drain region and the bonding region is stopped.

In the method of fabricating the OLED display panel, the step of forming the second gate electrode, the first source electrodes, and the first drain electrode comprises: sequentially forming a titanium layer, an aluminum layer, and a titanium layer on the second gate insulating layer to form the first metal layer with a three-layer stacked structure, and patterning the first metal layer to form the second gate electrode, the first source electrode, and the first drain electrode.

In the method of fabricating the OLED display panel, the step of forming the first gate electrode comprises: forming a metal layer on the first gate insulating layer, and patterning the metal layer to form a metal pattern as the first gate electrode.

An OLED display panel provided by the present disclosure comprises an array layer. The array layer comprises a buffer layer, and an active layer, a first gate insulating layer, a first gate electrode, a second gate insulating layer, a second gate electrode, a passivation layer, and an interlayer insulating layer that are sequentially disposed on the buffer layer. The array layer further comprises source electrodes and drain electrodes. The source electrodes comprise a first source electrode and a second source electrode disposed in contact with each other. The drain electrodes comprise a first drain electrode and a second drain electrode disposed in contact with each other. The first source electrode and the first drain electrode are in contact with the active layer through via holes. The first source/drain electrode and the second source/drain electrode are disposed in contact with each other, thereby improving yields of the via holes, the source electrodes, and the drain electrodes in a source/drain region, reducing a probability of abnormal via holes in the source/drain region, and facilitating wiring in the source/drain region.

BRIEF DESCRIPTION OF DRAWINGS

Specific implementation of the present disclosure will be described in detail below in conjunction with accompanying drawings to make technical solutions and beneficial effects of the present disclosure obvious.

DETAILED DESCRIPTION

Technical solutions in embodiments of the present disclosure will be clearly and completely described below in conjunction with accompanying drawings in the embodiments of the present disclosure. It is apparent that the described embodiments are merely a part of the embodiments of the present disclosure and not all embodiments. All other embodiments obtained by those skilled in the art based on the embodiments of the present disclosure without creative labor are within the claimed scope of the present disclosure.

In the description of the present disclosure, it should be understood that location or position relationships indicated by terms, such as "center", "longitudinal", "transverse", "length", "width", "thickness", "up", "down", "front", "rear", "left", "right", "vertical", "horizontal", "top", "bottom", "within", "outside", "clockwise", and "counterclockwise" are location or position relationships based on illustration of the accompanying drawings, are merely used for describing the present disclosure and simplifying the description instead of indicating or implying the indicated apparatuses or elements should have specified locations or be constructed and operated according to specified locations, and Thereof, should not be intercepted as limitations to the present disclosure. Furthermore, terms such as "first" and "second" are used merely for description, but shall not be construed as indicating or implying relative importance or implicitly indicating a number of the indicated technical feature. Hence, the feature defined with "first" and "second" may explicitly or implicitly includes one or more such features. In the description of the present disclosure, a term "a plurality of" means "two or more" unless otherwise specifically limited.

Figure 1:
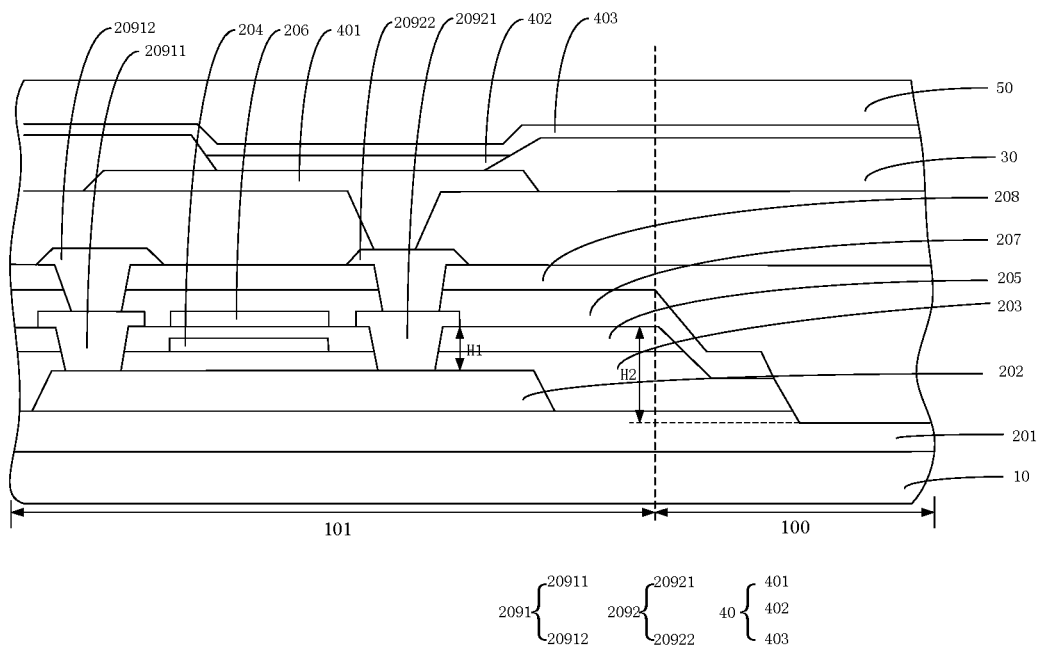
FIG. 1 is a schematic cross-sectional view of a first type of an organic light-emitting diode (OLED) display panel according to an embodiment of the present disclosure.
Figure 2:
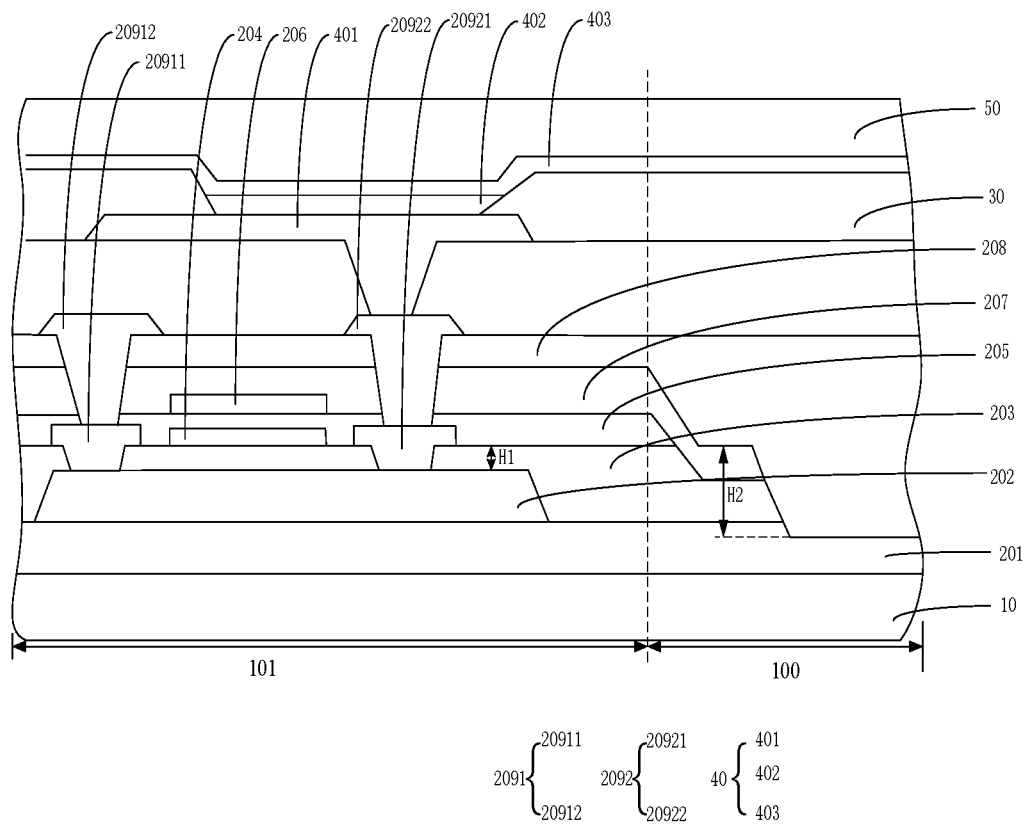
FIG. 2 is a schematic cross-sectional view of a second type of an OLED display panel according to an embodiment of the present disclosure.

As shown in FIG. 1 and FIG. 2, the present disclosure provides an organic light-emitting diode (OLED) display panel comprising a substrate 10, an array layer 20, a pixel defining layer 30, a light-emitting function layer 40, and an encapsulation layer 50. The array layer 20 comprises a buffer layer 201, and an active layer 202, a first gate insulating layer 203, a first gate electrode 204, a second gate insulating layer 205, a second gate electrode 206, a passivation layer 207, and an interlayer insulating layer 208 that are sequentially disposed on the buffer layer 201. The array layer 20 further comprises source electrodes 2091 and drain electrodes 2092. The source electrodes 2091 comprise a first source electrode 20911 and a second source electrode 20912 directly disposed on the first source electrode 20911. The drain electrodes 2092 comprise a first drain electrode 20921 and a second drain electrode 20922 directly disposed on the first drain electrode 20921. The first source electrode 20911 and the first drain electrode 20921 are in contact with the active layer 202 through via holes.

In this embodiment, the OLED display panel comprises the array layer 20. The array layer 20 comprises the buffer layer 201, and the active layer 202, the first gate insulating layer 203, the first gate electrode 204, the second gate insulating layer 205, the second gate electrode 206, the passivation layer 207, and the interlayer insulating layer 208 that are sequentially disposed on the buffer layer 201. The array layer 20 further comprises the source electrodes 2091 and the drain electrodes 2092. The source electrodes 2091 comprise the first source electrode 20911 and the second source electrode 20912 disposed in contact with each other. The drain electrodes 2092 comprise the first drain electrode 20921 and the second drain electrode 20922 disposed in contact with each other. The first source electrode 20911 and the first drain electrode 20921 are in contact with the active layer 202 through the via holes. The first source/drain electrode 20911/20921 and the second source/drain electrode 20912/20922 are disposed in contact with each other, thereby improving yields of the via holes, the source electrodes 2091, and the drain electrodes 2092 in a source/drain region, reducing a probability of abnormal via holes in the source/drain region, and facilitating wiring in the source/drain region.

A source/drain layer comprises a first source/drain layer and a second source/drain layer. The first source/drain layer comprises the first source electrode 20911 and the first drain electrode 20921. The second source/drain layer comprises the second source electrode 20912 and the second drain electrode 20922.

The source/drain layer is divided into the first source/drain layer and the second source/drain layer, thereby structurally facilitating wiring, and reducing fracture or poor contact of the source and drain electrodes in a manufacturing method without adding steps.

In an embodiment, the first source electrode 20911 and the first drain electrode 20921 are disposed in a same layer between the active layer 202 and the interlayer insulating layer 208, and the second source electrode 20912 and the second drain electrode 20922 are disposed on the interlayer insulating layer 208.

The first source/drain layer may be formed separately by a single process.

The first source/drain layer may also be formed simultaneously with an existing metal layer by a single process.

As shown in FIG. 2, the first source/drain layer may be in the same layer as the first gate electrode 204.

As shown in FIG. 1, the first source/drain layer may also be in the same layer as the second gate electrode 206.

The first source electrode 20911 and the first drain electrode 20921 may be disposed in a same layer as an existing metal layer. In a manufacturing process, the existing metal layer, the first source electrode 20911, and the first drain electrode 20921 are formed by patterning a same metal layer.

The second source electrode 20912 and the second drain electrode 20922 may also be disposed in a same layer as an existing metal layer. In a manufacturing process, the existing metal layer, the second source electrode 20912, and the second drain electrode 20922 are formed by patterning a same metal layer.

In an embodiment, as shown in FIG. 1, the first source electrode 20911, and the first drain electrode 20921 are disposed in the same layer as the second gate electrode 206.

The first source electrode 20911 contacts the active layer 202 through a first via hole penetrating through the first gate insulating layer 203 and the second gate insulating layer 205.

The second source electrode 20912 contacts the first source electrode 20911 through a second via hole penetrating through the passivation layer 207 and the interlayer insulating layer 208.

The first drain electrode 20921 contacts the active layer 202 through a third via hole penetrating through the first gate insulating layer 203 and the second gate insulating layer 205.

The second drain electrode 20922 contacts the first drain electrode 20921 through the fourth via hole penetrating through the passivation layer 207 and the interlayer insulating layer 208.

In an embodiment, as shown in FIG. 2, the first source electrode 20911, and the first drain electrode 20921 are disposed in the same layer as the first gate electrode 204.

The first source electrode 20911 contacts the active layer 202 through a first via hole penetrating through the first gate insulating layer 203.

The second source electrode 20912 contacts the first source electrode 20911 through a second via hole penetrating through the second gate insulating layer 205, the passivation layer 207, and the interlayer insulating layer 208.

The first drain electrode 20921 contacts the active layer 202 through a third via hole penetrating through the first gate insulating layer 20.

The second drain electrode 20922 contacts the first drain electrode 20921 through the fourth via hole penetrating through the second gate insulating layer 205, the passivation layer 207, and the interlayer insulating layer 208.

In an embodiment, the first source electrode 20911 and the second source electrode 20912 are made of different materials, and the first drain electrode 20921 and the second drain electrode 20922 are also made of different materials.

The first source electrode 20911 may be in the same layer as the second gate electrode 206. The first source electrode 20911 may be made of a titanium/aluminum/titanium stacked structure.

The second source electrode 20912 may be disposed on the interlayer insulating layer 208. The second source electrode 20912 may be made of titanium or silicon germanium.

The first drain electrode 20921 may be in the same layer as the second gate electrode 206. The first drain electrode 20921 may be made of a titanium/aluminum/titanium stacked structure.

The second drain electrode 20922 may be disposed on the interlayer insulating layer 208. The second drain electrode 20922 may be made of titanium or silicon germanium.

The present disclosure further provides an OLED display device comprising an OLED display panel, a diffusion sheet, an optical sheet, a reflection sheet, and a frame. As shown in FIG. 1 and FIG. 2, the OLED display panel comprises a substrate 10, an array layer 20, a pixel defining layer 30, a light-emitting function layer 40, and an encapsulation layer 50. The array layer 20 comprises a buffer layer 201, and an active layer 202, a first gate insulating layer 203, a first gate electrode 204, a second gate insulating layer 205, a second gate electrode 206, a passivation layer 207, and an interlayer insulating layer 208 that are sequentially disposed on the buffer layer 201. The array layer 20 further comprises source electrodes 2091 and drain electrodes 2092. The source electrodes 2091 comprise a first source electrode 20911 and a second source electrode 20912 directly disposed on the first source electrode 20911. The drain electrodes 2092 comprise a first drain electrode 20921 and a second drain electrode 20922 directly disposed on the first drain electrode 20921. The first source electrode 20911 and the first drain electrode 20921 are in contact with the active layer 202 through via holes.

In this embodiment, the OLED display panel comprises the array layer 20. The array layer 20 comprises the buffer layer 201, and the active layer 202, the first gate insulating layer 203, the first gate electrode 204, the second gate insulating layer 205, the second gate electrode 206, the passivation layer 207, and the interlayer insulating layer 208 that are sequentially disposed on the buffer layer 201. The array layer 20 further comprises the source electrodes 2091 and the drain electrodes 2092. The source electrodes 2091 comprise the first source electrode 20911 and the second source electrode 20912 disposed in contact with each other. The drain electrodes 2092 comprise the first drain electrode 20921 and the second drain electrode 20922 disposed in contact with each other. The first source electrode 20911 and the first drain electrode 20921 are in contact with the active layer 202 through the via holes. The first source/drain electrode 20911/20921 and the second source/drain electrode 20912/20922 are disposed in contact with each other, thereby improving yields of the via holes, the source electrodes 2091, and the drain electrodes 2092 in a source/drain region, reducing a probability of abnormal via holes in the source/drain region, and facilitating wiring in the source/drain region.

A source/drain layer comprises a first source/drain layer and a second source/drain layer. The first source/drain layer comprises the first source electrode 20911 and the first drain electrode 20921. The second source/drain layer comprises the second source electrode 20912 and the second drain electrode 20922.

The source/drain layer is divided into the first source/drain layer and the second source/drain layer, thereby structurally facilitating wiring, and reducing fracture or poor contact of the source and drain electrodes in a manufacturing method without adding steps.

In an embodiment, in the display device, the first source electrode 20911 and the first drain electrode 20921 are disposed in a same layer between the active layer 202 and the interlayer insulating layer 208, and the second source electrode 20912 and the second drain electrode 20922 are disposed on the interlayer insulating layer 208.

The first source/drain layer may be formed separately by a single process.

The first source/drain layer may also be formed simultaneously with an existing metal layer by a single process.

As shown in FIG. 2, the first source/drain layer may be in the same layer as the first gate electrode 204.

As shown in FIG. 1, the first source/drain layer may also be in the same layer as the second gate electrode 206.

The first source electrode 20911 and the first drain electrode 20921 may be disposed in a same layer as an existing metal layer. In a manufacturing process, the existing metal layer, the first source electrode 20911, and the first drain electrode 20921 are formed by patterning a same metal layer.

The second source electrode 20912 and the second drain electrode 20922 may also be disposed in a same layer as an existing metal layer. In a manufacturing process, the existing metal layer, the second source electrode 20912, and the second drain electrode 20922 are formed by patterning a same metal layer.

In an embodiment, as shown in FIG. 1, in the display device, the first source electrode 20911, and the first drain electrode 20921 are disposed in the same layer as the second gate electrode 206.

The first source electrode 20911 contacts the active layer 202 through a first via hole penetrating through the first gate insulating layer 203 and the second gate insulating layer 205.

The second source electrode 20912 contacts the first source electrode 20911 through a second via hole penetrating through the passivation layer 207 and the interlayer insulating layer 208.

The first drain electrode 20921 contacts the active layer 202 through a third via hole penetrating through the first gate insulating layer 203 and the second gate insulating layer 205.

The second drain electrode 20922 contacts the first drain electrode 20921 through the fourth via hole penetrating through the passivation layer 207 and the interlayer insulating layer 208.

In an embodiment, as shown in FIG. 2, in the display device, the first source electrode 20911, and the first drain electrode 20921 are disposed in the same layer as the first gate electrode 204.

The first source electrode 20911 contacts the active layer 202 through a first via hole penetrating through the first gate insulating layer 203.

The second source electrode 20912 contacts the first source electrode 20911 through a second via hole penetrating through the second gate insulating layer 205, the passivation layer 207, and the interlayer insulating layer 208.

The first drain electrode 20921 contacts the active layer 202 through a third via hole penetrating through the first gate insulating layer 20.

The second drain electrode 20922 contacts the first drain electrode 20921 through the fourth via hole penetrating through the second gate insulating layer 205, the passivation layer 207, and the interlayer insulating layer 208.

In an embodiment, in the display device, the first source electrode 20911 and the second source electrode 20912 are made of different materials, and the first drain electrode 20921 and the second drain electrode 20922 are also made of different materials.

The first source electrode 20911 may be in the same layer as the second gate electrode 206. The first source electrode 20911 may be made of a titanium/aluminum/titanium stacked structure.

The second source electrode 20912 may be disposed on the interlayer insulating layer 208. The second source electrode 20912 may be made of titanium or silicon germanium.

The first drain electrode 20921 may be in the same layer as the second gate electrode 206. The first drain electrode 20921 may be made of a titanium/aluminum/titanium stacked structure.

The second drain electrode 20922 may be disposed on the interlayer insulating layer 208. The second drain electrode 20922 may be made of titanium or silicon germanium.

Figure 3:
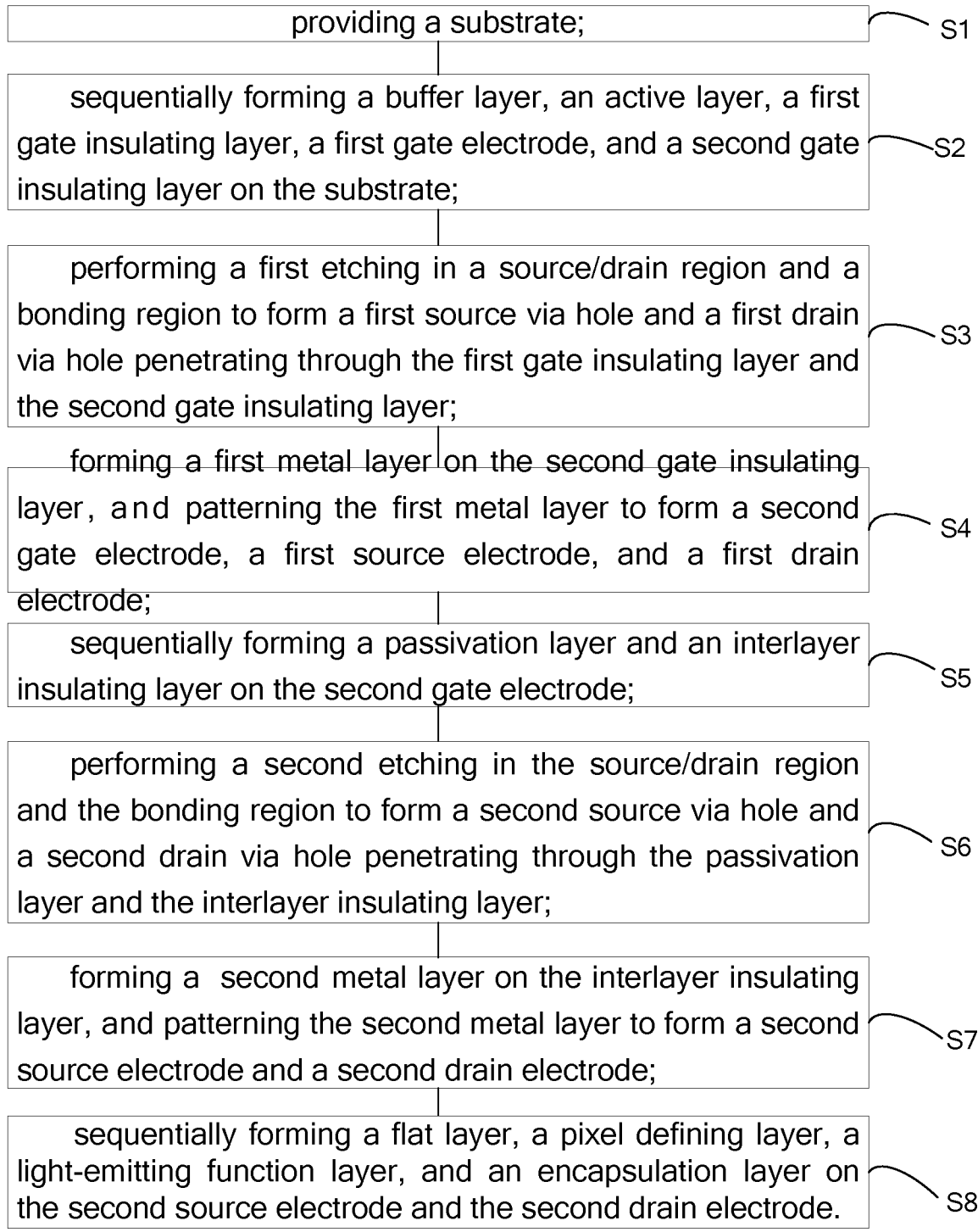
FIG. 3 is a flowchart of a method of fabricating an OLED display panel according to an embodiment of the present disclosure.

As shown in FIG. 1 to FIG. 3, the present disclosure further provides a method of fabricating an OLED display panel comprising:

S1: providing a substrate 10;
S2: sequentially forming a buffer layer 201, an active layer 202, a first gate insulating layer 203, a first gate electrode 204, and a second gate insulating layer 205 on the substrate 10;
S3: performing a first etching in a source/drain region and a bonding region to form a first source via hole and a first drain via hole penetrating through the first gate insulating layer 203 and the second gate insulating layer 205;
S4: forming a first metal layer on the second gate insulating layer 205, and patterning the first metal layer to form a second gate electrode 206, a first source electrode 20911, and a first drain electrode 20921;
S5: sequentially forming a passivation layer 207 and an interlayer insulating layer 208 on the second gate electrode 206;
S6: performing a second etching in the source/drain region and the bonding region to form a second source via hole and a second drain via hole penetrating through the passivation layer 207 and the interlayer insulating layer 208;
S7: forming a second metal layer on the interlayer insulating layer 208, and patterning the second metal layer to form a second source electrode 20912 and a second drain electrode 20922;
S8: sequentially forming a flat layer, a pixel defining layer 30, a light-emitting function layer 40, and an encapsulation layer 50 on the second source electrode 20912 and the second drain electrode 20922.

As shown in FIGS. 1 and 2, the first etching takes an etching depth H1 of the source/drain region 101 as a condition for stopping the first etching. When etching to a surface of the active layer 202, the first etching is stopped.

At this time, a hole depth H2 in a bonding region 100 is greater than the etching depth H1.

The second etching takes an etching depth of the bonding region 100 as a condition for stopping the second etching. The source/drain region 101 comprises the first source electrode 20911 and the first drain electrode 20921. An etching rate of the second etching on metal is very low. Therefore, when the via holes in the bonding area reach a preset depth, the second etching is stopped.

The first source electrode 20911, the first drain electrode 20921, and the second gate electrode 206 may be made of titanium/aluminum/titanium to meet a contact resistance between a source/drain layer and the active layer 202.

Via holes of source and drain electrodes are formed by two processes, respectively, and a first source/drain layer and a second source/drain layer are formed in contact with each other, thereby reducing fracture or poor contact of the source and drain electrodes in a manufacturing method without adding steps.

In an embodiment, in the step of performing the first etching in the source/drain region and the bonding region, when etching gas in the source/drain region reaches the active layer 202, the first etching in the source/drain region and the bonding region is stopped Etching gas easily etches the active layer 202. Therefore, after the etching gas reaches the active layer 202, the first etching will be stopped.

A sensor may be disposed on the surface of the active layer 202. The sensor is connected to an external amplifier and then electrically connected to software. A time to stop etching is controlled by the software.

In an embodiment, in the step of performing the second etching in the source/drain region and the bonding region, after etching gas reaches the first source electrode 20911 and the first drain electrode 20921 in the source/drain region, the etching gas etches metal materials slowly, so that when the bonding region is etched to a preset depth by the second etching, the second etching in the source/drain region and the bonding region is stopped.

In an embodiment, the step of forming the second gate electrode 206, the first source electrode 20911 and the first drain electrode 20921 comprises: sequentially forming a titanium layer, an aluminum layer, and a titanium layer on the second gate insulating layer 205 to form the first metal layer with a three-layer stacked structure; and patterning the first metal layer to form the second gate electrode 206, the first source electrode 20911, and the first drain electrode 20921.

In an embodiment, the step of forming the first gate electrode 204 comprises: forming a metal layer on the first gate insulating layer, and patterning the metal layer to form a metal pattern as the first gate electrode 204.

In an embodiment, after the first etching, the via holes are activated with hydrogen.

In an embodiment, after the second gate electrode 206 is formed, the passivation layer 207 is formed on the second gate electrode 206. The passivation layer 207 may be made of one or more of silicon nitride and silicon oxide.

In an embodiment, an organic layer is formed on the passivation layer 207, and the second source via hole and the second drain via hole are formed by an exposure process.

The organic layer can be filled into the via holes in the bonding region to increase flexibility and facilitate subsequent bending of the bonding region.

An OLED display panel provided by the present disclosure comprises an array layer. The array layer comprises a buffer layer, and an active layer, a first gate insulating layer, a first gate electrode, a second gate insulating layer, a second gate electrode, a passivation layer, and an interlayer insulating layer that are sequentially disposed on the buffer layer. The array layer further comprises source electrodes and drain electrodes. The source electrodes comprise a first source electrode and a second source electrode disposed in contact with each other. The drain electrodes comprise a first drain electrode and a second drain electrode disposed in contact with each other. The first source electrode and the first drain electrode are in contact with the active layer through via holes. The first source/drain electrode and the second source/drain electrode are disposed in contact with each other, thereby improving yields of the via holes, the source electrodes, and the drain electrodes in a source/drain region, reducing a probability of abnormal via holes in the source/drain region, and facilitating wiring in the source/drain region.

The OLED display panel and the method of fabricating the same provided by the embodiments of the present disclosure are described in detail above. The present disclosure uses specific examples to describe principles and embodiments of the present application. The above description of the embodiments is only for helping to understand the technical solutions of the present disclosure and its core ideas. It should be understood by those skilled in the art that they can modify the technical solutions recited in the foregoing embodiments, or replace some of technical features in the foregoing embodiments with equivalents. These modifications or replacements do not cause essence of corresponding technical solutions to depart from the scope of the technical solutions of the embodiments of the present disclosure.

What is claimed is:

1. A method of fabricating an organic light-emitting diode (OLED) display panel, comprising:
providing a substrate;
sequentially forming a buffer layer, an active layer, a first gate insulating layer, a first gate electrode, and a second gate insulating layer on the substrate;
performing a first etching in a source/drain region and a bonding region to form a first source via hole and a first drain via hole penetrating through the first gate insulating layer and the second gate insulating layer, and when etching gas in the source/drain region reaches the active layer, stopping the first etching in the source/drain region and the bonding region, wherein a hole depth of the bonding region is greater than a depth of the first source via hole and a depth of the first drain via hole;
forming a first metal layer on the second gate insulating layer;
patterning the first metal layer to form a second gate electrode, a first source electrode, and a first drain electrode;
sequentially forming a passivation layer and an interlayer insulating layer on the second gate electrode;
performing a second etching in the source/drain region and the bonding region to form a second source via hole and a second drain via hole penetrating through the passivation layer and the interlayer insulating layer;
forming a second metal layer on the interlayer insulating layer;
patterning the second metal layer to form a second source electrode and a second drain electrode; and sequentially forming a flat layer, a pixel defining layer, a light-emitting function layer, and an encapsulation layer on the second source electrode and the second drain electrode.

2. The method of fabricating the OLED display panel according to claim 1, wherein in the step of performing the second etching in the source/drain region and the bonding region, after etching gas reaches the first source electrode and the first drain electrode in the source/drain region when the bonding region is etched to a preset depth by the second etching, stopping the second etching in the source/drain region and the bonding region.

3. The method of fabricating the OLED display panel according to claim 1, wherein the step of forming the second gate electrode, the first source electrode, and the first drain electrode comprises:

sequentially forming a titanium layer, an aluminum layer, and a titanium layer on the second gate insulating layer to form the first metal layer with a three-layer stacked structure; and patterning the first metal layer to form the second gate electrode, the first source electrode, and the first drain electrode.

4. The method of fabricating the OLED display panel according to claim 1, wherein the step of forming the first gate electrode comprises:

forming a metal layer on the first gate insulating layer; and
patterning the metal layer to form a metal pattern as the first gate electrode.

5. The method of fabricating the OLED display panel according to claim 1, the first source electrode and the second source electrode are made of different materials, and the first drain electrode and the second drain electrode are also made of different materials.

6. The method of fabricating the OLED display panel according to claim 5, wherein the first source electrode is made of a titanium/aluminum/titanium stacked structure.

7. The method of fabricating the OLED display panel according to claim 5, wherein the second source electrode is made of titanium or silicon germanium.

* * * * *